(12) United States Patent
 Yoo (10) Patent No.: US 12,088,127 B2
(45) Date of Patent: Sep. 10, 2024

(54) IC CHIP AND CIRCUIT SYSTEM USING THE SAME

(71) Applicant: LG Energy Solution, LTD., Seoul (KR)

(72) Inventor: Sol Ji Yoo, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 456 days.

(21) Appl. No.: 17/414,122

(22) PCT Filed: Feb. 11, 2020

(86) PCT No.: PCT/KR2020/001864
§ 371 (c)(1),
(2) Date: Jun. 15, 2021

(87) PCT Pub. No.: WO2020/171456
PCT Pub. Date: Aug. 27, 2020

(65) Prior Publication Data
US 2022/0045520 A1    Feb. 10, 2022

(30) Foreign Application Priority Data
Feb. 19, 2019 (KR) .................. 10-2019-0018990

(51) Int. Cl.
*H01M 10/42* (2006.01)
*H02J 7/00* (2006.01)
(Continued)

(52) U.S. Cl.
CPC ............ *H02J 7/0013* (2013.01); *H02J 50/80* (2016.02); *H04B 5/79* (2024.01); *H05K 1/14* (2013.01); *H05K 1/181* (2013.01); *H04B 5/24* (2024.01)

(58) Field of Classification Search
CPC ...... H02J 7/0013; H02J 50/80; H02J 2207/10; H02J 7/00032; H02J 7/0047; H02J 50/10;
(Continued)

(56) References Cited

U.S. PATENT DOCUMENTS 8,203,232 B2 * 6/2012 Pino ................... B60L 3/0069
307/10.1
8,525,370 B2 * 9/2013 Walley ................ H04B 5/0037
307/104
(Continued)

FOREIGN PATENT DOCUMENTS

CN  1568545 A    1/2005
CN  101542830 A  9/2009
(Continued)

OTHER PUBLICATIONS

International Search Report for Application No. PCT/KR2020/001864 mailed May 20, 2020, pp. 1-2.
(Continued)

*Primary Examiner* — Nha T Nguyen
(74) *Attorney, Agent, or Firm* — Lerner David LLP (57) ABSTRACT

A circuit system including a first IC chip arranged in a first voltage region on a circuit board, and a second IC chip arranged in a second voltage region on the circuit board, each of the first IC chip and the second IC chip including a data communication unit to wirelessly transmit/receive data and a power transmission/reception unit to wirelessly transmit/receive power. The first IC chip and the second IC chip wirelessly transfer data and power to each other in an insulated state between the first voltage region and the second voltage region.

13 Claims, 4 Drawing Sheets

(51) Int. Cl.
*H02J 50/80* (2016.01)
*H04B 5/79* (2024.01)
*H05K 1/14* (2006.01)
*H05K 1/18* (2006.01)
*H04B 5/24* (2024.01)

(58) Field of Classification Search
CPC . H02J 2310/22; H04B 5/0037; H04B 5/0075; H04B 5/0031; H05K 1/14; H05K 1/181; H01L 25/16; H01L 25/18; H01L 23/48; H01L 25/0655; H01M 10/44; H01M 10/46; H01M 10/48; H01M 10/486; H01M 2010/4271; H01M 2010/4278; H01M 10/425; Y02E 60/10
See application file for complete search history.

(56) References Cited

U.S. PATENT DOCUMENTS

| | | | | |
|---|---|---|---|---|
| 9,893,385 | B1* | 2/2018 | Nayar | H01M 10/399 |
| 10,182,116 | B2* | 1/2019 | Sankaran | H04L 67/12 |
| 10,818,591 | B2* | 10/2020 | Uchida | H01L 23/53295 |
| 11,048,494 | B2* | 6/2021 | Stemmer | G06F 8/65 |
| 2005/0006137 | A1 | 1/2005 | Alcoe et al. | |
| 2007/0205855 | A1 | 9/2007 | Hashimoto | |
| 2009/0021352 | A1 | 1/2009 | Kataya et al. | |
| 2009/0174353 | A1 | 7/2009 | Nakamura et al. | |
| 2009/0184760 | A1* | 7/2009 | Hauenstein | B60W 20/00 327/594 |
| 2011/0254123 | A1 | 10/2011 | Sellathamby et al. | |
| 2012/0064827 | A1 | 3/2012 | Kim et al. | |
| 2012/0286717 | A1 | 11/2012 | Fukuta et al. | |
| 2013/0059182 | A1 | 3/2013 | Komatsu et al. | |
| 2013/0088237 | A1 | 4/2013 | Kamata et al. | |
| 2013/0257383 | A1 | 10/2013 | Shim | |
| 2013/0324041 | A1* | 12/2013 | Pagani | H05K 1/165 455/41.1 |
| 2014/0055079 | A1 | 2/2014 | Lee | |
| 2014/0253227 | A1* | 9/2014 | Yach | H01L 23/49575 327/540 |
| 2015/0331058 | A1 | 11/2015 | Kamata | |
| 2016/0043067 | A1* | 2/2016 | Yamaji | H01L 27/092 257/357 |
| 2016/0049994 | A1 | 2/2016 | Lee et al. | |
| 2016/0172721 | A1 | 6/2016 | Komatsu et al. | |
| 2016/0247389 | A1 | 8/2016 | Shimizu et al. | |
| 2016/0261124 | A1 | 9/2016 | Kang et al. | |
| 2016/0261125 | A1 | 9/2016 | Kang et al. | |
| 2016/0268642 | A1 | 9/2016 | Yamazoe et al. | |
| 2016/0285311 | A1 | 9/2016 | Masumoto et al. | |
| 2016/0356857 | A1 | 12/2016 | Kaupp et al. | |
| 2016/0380442 | A1 | 12/2016 | Kang et al. | |
| 2017/0021733 | A1 | 1/2017 | Kondou et al. | |
| 2017/0179010 | A1* | 6/2017 | Takada | H01L 24/49 |
| 2017/0373520 | A1 | 12/2017 | Sugeno et al. | |
| 2018/0130587 | A1* | 5/2018 | Tanaka | H01L 28/10 |
| 2018/0212278 | A1 | 7/2018 | Kurosaki et al. | |
| 2018/0241100 | A1 | 8/2018 | Kudo et al. | |
| 2018/0293062 | A1* | 10/2018 | Stemmer | G06F 8/656 |
| 2019/0265304 | A1 | 8/2019 | Kim et al. | |
| 2019/0356143 | A1 | 11/2019 | Lee et al. | |
| 2020/0011922 | A1 | 1/2020 | Yoon et al. | |
| 2020/0091735 | A1 | 3/2020 | Cho et al. | |
| 2021/0141026 | A1* | 5/2021 | Kim | H02J 7/0013 |
| 2023/0335333 | A1* | 10/2023 | Cremasco | H01F 27/346 |

FOREIGN PATENT DOCUMENTS

| | | |
|---|---|---|
| CN | 203119580 U | 8/2013 |
| CN | 104882919 A | 9/2015 |
| CN | 105990914 A | 10/2016 |
| CN | 108770186 A | 11/2018 |
| JP | 2012239251 A | 12/2012 |
| JP | 2013083514 A | 5/2013 |
| JP | 2015220813 A | 12/2015 |
| JP | WO2014038180 A1 | 8/2016 |
| JP | 2016157681 A | 9/2016 |
| JP | 2017028900 A | 2/2017 |
| JP | WO2017043237 A1 | 3/2018 |
| JP | WO2017110049 A1 | 10/2018 |
| KR | 20090130420 A | 12/2009 |
| KR | 20110135267 A | 12/2011 |
| KR | 20130024786 A | 3/2013 |
| KR | 101294002 B1 | 8/2013 |
| KR | 20130101457 A | 9/2013 |
| KR | 20130112739 A | 10/2013 |
| KR | 101392899 B1 | 5/2014 |
| KR | 20140110574 A | 9/2014 |
| KR | 20160062194 A | 6/2016 |
| KR | 20160070774 A | 6/2016 |
| KR | 20180059209 A | 6/2018 |
| KR | 20180073241 A | 7/2018 |
| KR | 20190010032 A | 1/2019 |
| KR | 20190011568 A | 2/2019 |
| WO | 2016132414 A1 | 8/2016 |

OTHER PUBLICATIONS

Partial European Search Report for Application No. EP 20759247.8, dated Aug. 9, 2021, 13 pages.
Extended Search Report for European Application No. 20759247.8 dated Jan. 4, 2022. 10 pgs.
Search Report dated Aug. 29, 2023 from the Office Action for Chinese Application No. 202080006912.3 issued Aug. 30, 2023, 3 pages. [See p. 1-2, categorizing the cited references].

* cited by examiner

PRIOR ART

IC CHIP AND CIRCUIT SYSTEM USING THE SAME

TECHNICAL FIELD

Cross-Reference to Related Applications

The present application is a national phase entry under 35 U.S.C. § 371 of International Application No. PCT/KR2020/001864 filed Feb. 11, 2020, which claims priority from Korean Patent Application No. 10-2019-0018990, filed on Feb. 19, 2019, all of which are incorporated herein by reference.

TECHNICAL FIELD

The present invention relates to an IC chip and a circuit system using the same.

BACKGROUND ART

In a conventional battery management system (BMS), an insulating element (e.g., a digital isolator and a transformer) is used between different voltage regions on a BMS board in order to transfer data and power in an insulated state. For example, one-side terminal of the insulating element is connected to a first voltage region (e.g., a high-voltage region) of the BMS board, and the other-side terminal of the insulating element is connected to a second voltage region (e.g., a low-voltage region) of the BMS board.

Such an insulating element is arranged to connect different voltage regions, and is thus required to satisfy set standards such as an insulation voltage, an insulation resistance value, etc. to secure an insulation distance and creepage distance between the different voltage regions. Here, as the voltage difference between the different voltage regions increases, the insulation distance and creepage distance required to be secured increases. Therefore, as the voltage difference between the different voltage regions increases, the size of the insulating element increases.

Furthermore, when the insulating element is broken, the BMS board is damaged due to insulation breakdown. Moreover, although the insulating element itself is designed to secure a predetermined creepage distance as described above, the insulating element cannot be applied if a circuit system to which the insulating element is to be applied requires insulation with a longer creepage distance than the creepage distance secured by the insulating element.

SUMMARY

Technical Problems

The object of the present invention, which has been derived to resolve the above problems, is to provide a circuit system and IC chip which use, instead of an insulating element, two IC elements capable of wirelessly transmitting/receiving data and power in an insulated state.

Technical Solution

A circuit system according to an embodiment of the present invention includes a first integrated circuit (IC) chip positioned in a first voltage region of the circuit system, and a second IC chip positioned in a second voltage region of the circuit system, wherein the first voltage region and the second voltage region are in an insulated state from one another, wherein each of the first IC chip and the second IC chip includes a respective data communication unit configured to wirelessly transmit/receive data and a power transmission/reception unit configured to wirelessly transmit/receive power. Here, the first IC chip and the second IC chip are configured to wirelessly transfer data and power to each other in the insulated state between the first voltage region and the second voltage region.

The first IC chip and second IC chip may be positioned on separate circuit boards to maintain the insulated state.

The first voltage region may be a high-voltage region of at least a predetermined voltage, and the second voltage region may be a low-voltage region of less than the predetermined voltage.

The first IC chip and the second IC chip may be positioned on a common circuit board at least a predetermined insulation distance apart to maintain the insulated state. For example, the first IC chip and the second IC chip may be arranged to be spaced a predetermined minimum insulation distance.

The power transmission/reception unit may be configured to wirelessly transmit/receive power using a wireless charging technology.

For example, the circuit system may be included in a battery management system (BMS).

A plurality of IC chips according to an embodiment of the present invention are arranged in respective voltage regions of a circuit system, wherein the respective voltage regions are in an insulated state from one another, each of the plurality of IC chips including a data communication unit configured to wirelessly transmit/receive data between different IC chips while maintaining the insulated state between the respective voltage regions, and a power transmission/reception unit capable of wirelessly transmit/receive power between the different IC chips while maintaining the insulated state between the respective voltage regions.

At least two of the plurality of IC chips may be positioned on separate circuit boards to maintain the insulated state.

Here, the different voltage regions include a first voltage region which is a high-voltage region of at least a predetermined voltage and a second voltage region which is a low-voltage region of less than the predetermined voltage.

The plurality of IC chips are positioned on a common circuit board at least a predetermined insulation distance apart from one another to maintain the insulated state For example, each of the plurality of IC chips is spaced a predetermined minimum insulation distance from at least another one of the plurality of IC chips.

The power transmission/reception unit may be configured to wirelessly transmit/receive power using a wireless charging technology.

In addition, the present invention may be implemented as a battery pack. A battery pack according to an embodiment of the present invention includes: a plurality of battery cells; and a battery management system configured to manage charging/discharging of the battery cells, wherein the battery management system includes: a first circuit board of a first voltage region having a predetermined voltage range; a second circuit board of a second voltage region having a voltage range lower than that of the first voltage region; and, a circuit element comprising at least the first IC chip arranged on the first circuit board and a second IC chip arranged on the second circuit board.

Effects of the Invention

According to the present invention, two IC elements capable of wirelessly transmitting/receiving data and power in an insulated state are used instead of an insulating element, thus making it possible to design a circuit regardless of securement of a creepage distance or insulation breakdown due to an insulating element. Moreover, since the size of each IC element is not affected by the insulation distance and creepage distance, it is not necessary to increase the size in consideration of the insulation distance and creepage distance. Thus, when designing a circuit, the present invention may accord with a technical trend that requires an increased voltage of a battery and a smaller package.

Other effects of the present invention will be further described according to embodiments.

DETAILED DESCRIPTION

Hereinafter, various embodiments of the present invention will be described in detail with reference to the accompanying drawings. However, it should be understood that the present invention is not limited to specific embodiments, but rather includes various modifications, equivalents and/or alternatives of various embodiments of the present invention. Regarding description of the drawings, like reference numerals may refer to like elements.

The terminology used herein is only for describing specific embodiments rather than limiting the scope of other embodiments. The terms of a singular form may include plural forms unless otherwise specified. The terms used herein, including technical or scientific terms, have the same meanings as understood by those skilled in the art. Commonly-used terms defined in a dictionary may be interpreted as having meanings that are the same as or similar to contextual meanings defined in the related art, and should not be interpreted in an idealized or overly formal sense unless otherwise defined explicitly. Depending on cases, even the terms defined herein should not be such interpreted as to exclude embodiments of the present invention.

The terms "first", "second", "A", "B", "(a)", "(b)" and the like may be used herein to describe elements of the embodiments of the present invention. However, the terms are only used to distinguish one element from other elements, and the attributes or order of the elements are not limited by the terms. It will be understood that when an element is referred to as being "connected", "coupled", or "accessed" to or by another element, it can be directly connected or accessed to or by the other element, or intervening elements may be present.

Figure 1:
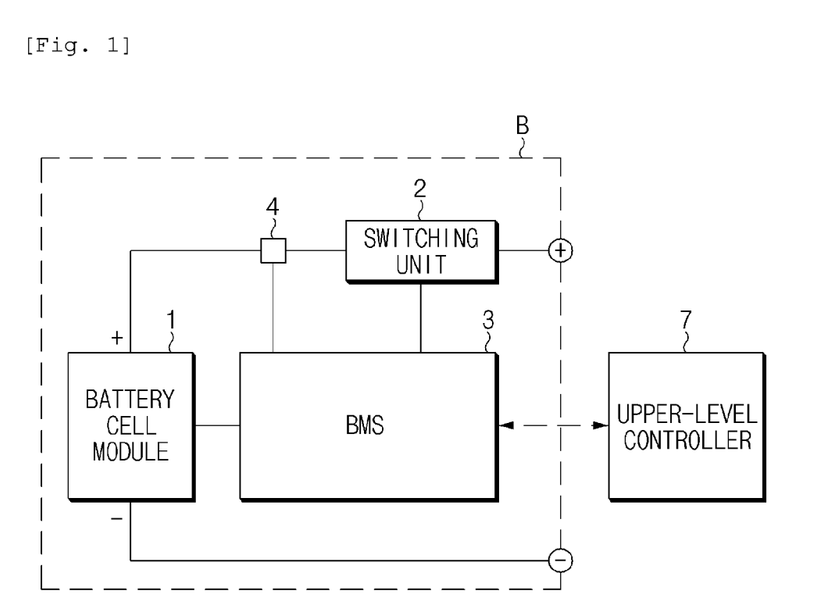
FIG. 1 is a block diagram schematically illustrating a configuration of a battery pack.

A configuration of a battery pack will be described with reference to FIG. 1. FIG. 1 is a block diagram schematically illustrating a configuration of a battery pack.

As illustrated in FIG. 1, a battery pack B includes a battery module 1 including at least one battery cell and capable of being charged/discharged, a switching unit 2 connected in series to a positive terminal side or negative terminal side of the battery module 1 to control a charging/discharging current flow of the battery module 1, and a battery management system 3, which monitors a voltage, current, temperature, and the like of the battery pack B to prevent overcharge and overdischarge.

Here, the switching unit 2 may use a semiconductor switching element for controlling a current flow for charging or discharging the battery module 1, for example, at least one MOSFET.

Furthermore, the BMS 3 may measure or calculate a voltage and current of a gate, source, and drain of the semiconductor switching element to monitor the voltage, current, temperature, and the like of the battery pack B, and may measure the current, voltage, and temperature of the battery pack using various sensors 4 arranged adjacent to the semiconductor switching element. The BMS 3 may include, as an interface for receiving an input of measurement values of the above-described various parameters, a plurality of terminals and a circuit connected to the terminals to process input values.

Furthermore, the BMS 3 may control ON/OFF of the MOSFET, and may be connected to the battery module 1 to monitor a state of the battery module 1.

Furthermore, the BMS 3 may be connected to an upper-level controller 7. The BMS 3 may transmit information about a state and control of a battery to the upper-level controller 7, or may control operation of the battery pack B on the basis of a control signal applied from the upper-level controller 7. The BMS 3 may exchange various signals and data with the upper-level controller 7 wirelessly or by wire. The battery pack B may be, for example, a vehicle battery pack, and the upper-level controller 7 may be a microcontroller unit (MCU) of a vehicle system. However, the field of application of the upper-level controller 7 is not limited to the field of vehicles, and thus the upper-level controller 7 is applicable to any cases in which a plurality of battery packs are used and managed (e.g., an energy storage system (ESS)).

Furthermore, the BMS 3 may be implemented as a circuit system arranged on a circuit board and including different voltage regions when designing a circuit.

Here, the present invention is characterized by using two IC chips having an inter-chip wireless data communication function and an inter-chip wireless power transmission/reception function, rather than using a conventional insulating element, in order to perform data communication and transfer power between different voltage regions.

Figure 2:
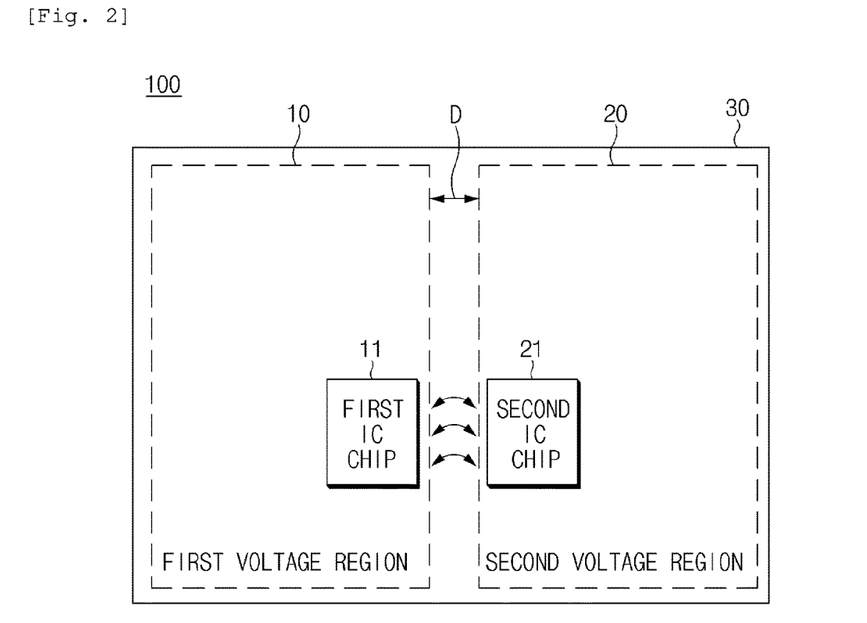
FIG. 2 is a conceptual diagram illustrating a configuration of a circuit system according to an embodiment of the present invention.

In detail, a circuit system according to an embodiment of the present invention will be described with reference to FIG. 2. FIG. 2 is a conceptual diagram illustrating a configuration of a circuit system according to an embodiment of the present invention.

As illustrated in FIG. 2, a circuit system 100 according to an embodiment of the present invention includes at least a first voltage region 10 and a second voltage region 20 as different voltage regions on a circuit board 30.

The first voltage region 10, for example, is a high-voltage region of at least a predetermined voltage and represents a first circuit unit.

The second voltage region 20, for example, is a low-voltage region of less than a predetermined voltage and represents a second circuit unit.

For example, each of the first voltage region 10 and the second voltage region 20 may include circuit configurations such as a microcontroller (MCU) for controlling various processes and each element of a BMS, a memory, in which an operating system program and various programs (e.g., a battery charging/discharging control program, a battery abnormality diagnosis program, or the like) are recorded, an input/output interface, which provides an input interface and output interface between a battery and/or a switching unit, and a communication interface capable of communicating with the outside via a wired/wireless communication network. Alternatively, the above configurations may be provided to only one of the first voltage region 10 and the second voltage region 20 as necessary. Alternatively, some of the above configurations may be provided to only one of the first voltage region 10 and the second voltage region 20, and some of the above configurations may be provided to both the first voltage region 10 and the second voltage region 20.

The first voltage region 10 and the second voltage region 20 are spaced at least a predetermined insulation distance D apart in order to maintain an insulated state.

For example, the first voltage region 10 and the second voltage region 20 may be arranged on a single circuit board in a state in which the predetermined insulation distance is secured, or may be respectively arranged on separate individual circuit boards. FIG. 2 illustrates that the first voltage region 10 and the second voltage region 20 are arranged on the single circuit board 30.

Herein, although the first voltage region is described as a high-voltage region and the second voltage region is described as a low-voltage region, the present invention is not limited thereto, and, thus, the first voltage region may be a low-voltage region and the second voltage region may be a high-voltage region.

The circuit system 100 according to an embodiment of the present invention includes a first IC chip 11 and a second IC chip 21.

The first IC chip 11 is an integrated circuit chip arranged in the first voltage region 10 on the circuit board 30.

The second IC chip 21 is an integrated circuit chip arranged in the second voltage region 20 on the circuit board 30.

The first IC chip 11 and the second IC chip 21 are characterized by wirelessly transferring data and power to each other in an insulated state.

Here, the first IC chip 11 and the second IC chip 21 are spaced at least the insulation distance D apart in order to maintain an insulated state. For example, the first IC chip 11 and the second IC chip 21 may be arranged to be spaced a shortest distance apart satisfying the predetermined insulation distance D. That is, it is desirable that the distance between the first IC chip 11 and the second IC chip 21 is as close as possible to the insulation distance D. Due to this configuration, the efficiency of inter-chip data communication and power transmission/reception can be maximized, and an effect such as noise that occurs in circuit units of the first voltage region 10 and the second voltage region 20 can be minimized.

Each of the first IC chip 11 and the second IC chip 21 may include a data communication unit capable of wirelessly transmitting/receiving data between different IC chips and a power transmission/reception unit capable of wirelessly transmitting/receiving power between different IC chips.

Figure 3:
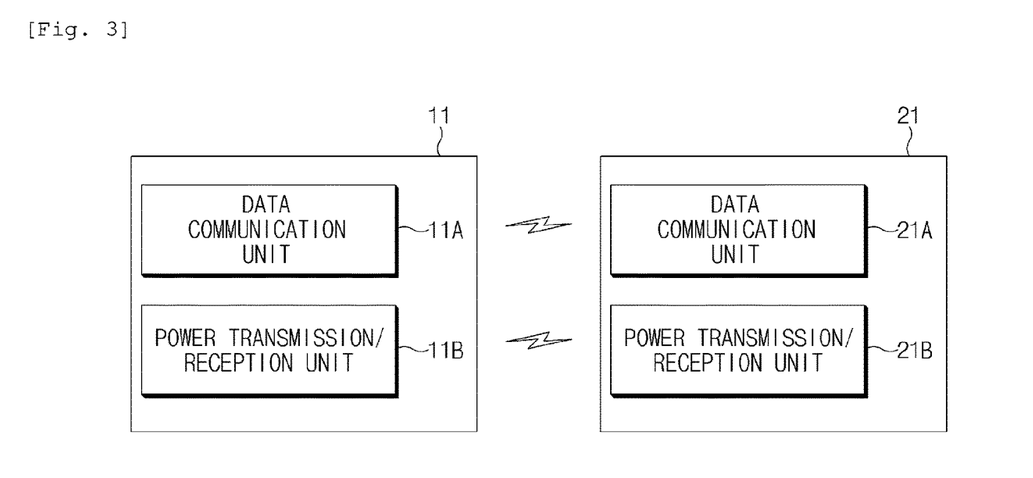
FIG. 3 is a block diagram illustrating a first IC chip and the second IC chip according to an embodiment of the present invention.

In detail, the first IC chip and the second IC chip will be described with reference to FIG. 3. FIG. 3 is a block diagram illustrating a first IC chip and the second IC chip according to an embodiment of the present invention.

As illustrated in FIG. 3, the first IC chip 11 includes a first data communication unit 11A capable of wirelessly transmitting/receiving data to/from the second IC chip 21 and a first power transmission/reception unit 11B capable of wirelessly transmitting/receiving power to/from the second IC chip 21. Likewise, the second IC chip 21 includes a second data communication unit 21A capable of wirelessly transmitting/receiving data to/from the first IC chip 11 and a second power transmission/reception unit 21B capable of wirelessly transmitting/receiving power to/from the first IC chip 11.

For example, data communication may be wirelessly performed between the first data communication unit 11A and the second data communication unit 21A using, for example, a short-range communication technology. The data communication may be bidirectional communication or unidirectional communication. The short-range communication technology is well known, and thus will not be described in detail.

Furthermore, power transmission/reception may be wirelessly performed between the first power transmission/reception unit 11B and the second power transmission/reception unit 21B using, for example, a wireless power transmission technology. For example, the first power transmission/reception unit 11B may be supplied with power from a power supply such as a battery module or the like to transfer power to the second power transmission/reception unit 21B.

Figure 4:
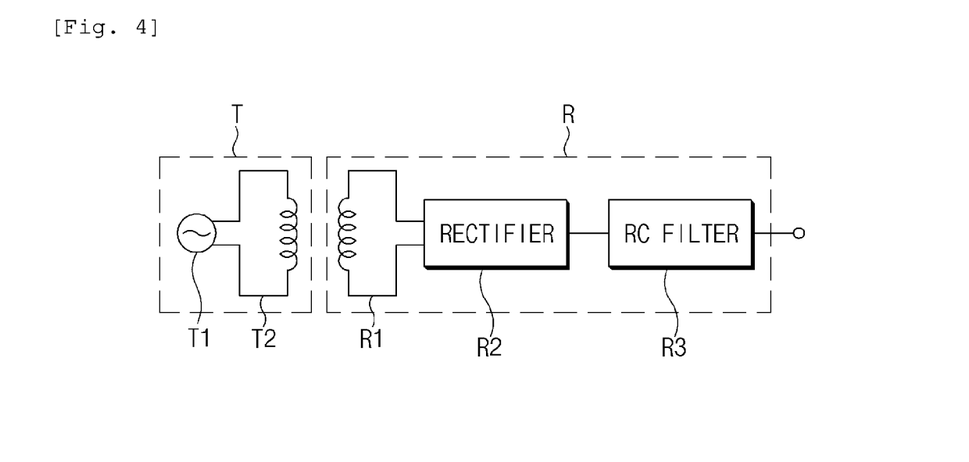
FIG. 4 is a configuration diagram illustrating a wireless power transfer technology using an inductive coupling scheme.

The wireless power transmission technology may use, for example, an inductive coupling scheme or the like. According to the inductive coupling scheme, magnetic fields are generated in coils of a transmitting end to induce electricity in coils of a receiving end to thereby transfer power, wherein the supplied power may be controlled by adjusting variables such as the numbers of turns in the coils of the transmitting end and receiving end, the sizes and positions of the two coils, and the distance between the two coils. For example, as illustrated in FIG. 4, the first power transmission/reception unit 11B, i.e., the side of a transmitting end T, may include a transmitting end coil T2 and an oscillator T1 which converts DC power into an AC signal that can be wirelessly transmitted and outputs the AC signal. Furthermore, the second power transmission/reception unit 21B, i.e., the side of a receiving end R, may include a receiving end coil R1, a rectifier R2 for converting an AC signal into a DC signal, and an RC filter R3 for removing noise. Furthermore, in addition to the inductive coupling scheme, a resonant magnetic coupling scheme or RF-based scheme may be used.

For example, a power transmission/reception unit such as the first power transmission/reception unit 11B and the second power transmission/reception unit 21B may wirelessly transmit/receive power using a wireless charging technology.

Since such a wireless power transfer technology is a known technology applied in wireless charging of a battery, more detailed descriptions are not provided.

Furthermore, each of the first IC chip 11 and the second IC chip 21 is described as including both a data communication unit and a power transmission/reception unit, but may include, for example, only the power transmission/reception unit according to an embodiment.

Furthermore, although FIG. 3 only illustrates the data communication units 11A and 21A and the power transmission/reception units 11B and 21B of the first IC chip 11 and the second IC chip 21, this illustration is merely for convenience, and a person skilled in the art could obviously understood that an interface such as various terminals, a control circuit, and the like may be included.

For example, the circuit board 30 may be a circuit board of a BMS. Furthermore, the BMS may be a BMS of a battery pack applied to a vehicle.

Figure 5:
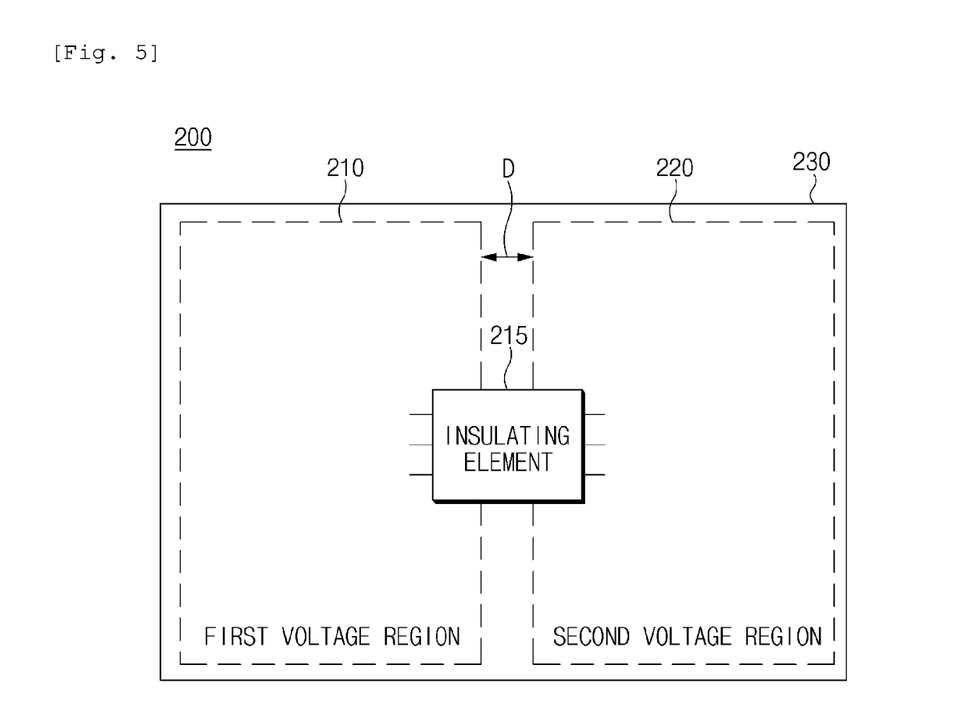
FIG. 5 is a conceptual diagram illustrating a circuit system using a conventional insulating element.

According to the prior art, as illustrated in FIG. 5, the insulation distance D is provided between a first voltage region 210 and a second voltage region 220 in a circuit system 200, according to an international insulation standard (for example, IEC 16950-1, IEC 62477, UL) related to an insulation distance and insulation test. For example, in the case where the first voltage region 210 is a high-voltage region of 1000 V and the second voltage region 220 is a low-voltage region of less than 5 V, an insulation distance of at least 8 mm is required to be secured as the insulation distance D for a 1000 V circuit system. Furthermore, the first voltage region 210 and the second voltage region 220 having this insulation distance therebetween transmit/receive signals/data and power via an insulating element 215 (e.g., a digital isolator and a transformer). An insulating element is required to satisfy an insulation distance and creepage distance suitable for a system voltage and required to pass an insulation test for the insulation distance and creepage distance. In particular, as a circuit system voltage increases, the size of an insulating element increases since authentication or standard related to insulation becomes stricter.

In other words, since a conventional insulating element is arranged across a gap between the first voltage region 210 and the second voltage region 220, the insulation distance D and creepage distance to be secured increase as a voltage difference between the first voltage region 210 and the second voltage region 220 increases due to a circuit system design, thus causing an increase in the size (or length) of the insulating element. The increase in the size of an insulating element is disadvantageous to a reliability test such as a tensile force test for a circuit board (e.g., printed circuit board (PCB)), and does not accord with a technical trend that requires a smaller package. Furthermore, in the case where a circuit board is flexible, a large or long insulating element may be broken or detached when the circuit board is bent. Thus, a conventional insulating element is unable to cope with an increased voltage of a battery.

However, according to the above-mentioned embodiment of the present invention, two IC elements capable of wirelessly transmitting/receiving data and power in an insulated state are used instead of an insulating element, thus making it possible to design a circuit regardless of securement of a creepage distance or insulation breakdown due to an insulating element. Moreover, since the size of each IC element is not affected by the insulation distance and creepage distance, it is not necessary to increase the size in consideration of the insulation distance and creepage distance. Thus, when designing a circuit, the present invention may accord with a technical trend that requires an increased voltage of a battery and a smaller package.

Figure 6:
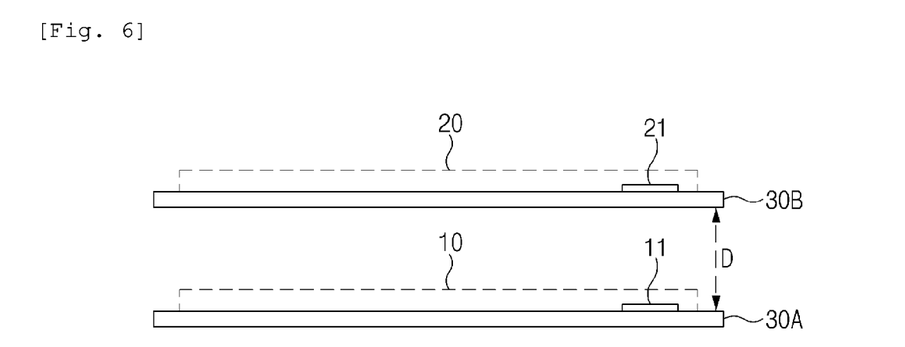
FIG. 6 is a conceptual diagram illustrating a configuration of a circuit system according to another embodiment of the present invention.

A circuit system according to another embodiment of the present invention will be described with reference to FIG. 6. FIG. 6 is a conceptual diagram illustrating a configuration of a circuit system according to another embodiment of the present invention.

As illustrated in FIG. 6, the circuit system according to another embodiment of the present invention may be designed so that the first voltage region 10 and the second voltage region 20 are arranged on different circuit boards 30A and 30B rather than a single circuit board.

For example, the first voltage region 10 may be arranged on the first circuit board 30A, and the second voltage region 20 may be arranged on the second circuit board 30B. The first circuit board 30A and the second circuit board 30B may be laminated. Here, the first IC chip 11 is arranged in the first voltage region 10 on the first circuit board 30A, and the second IC chip 21 is arranged in the second voltage region 20 on the second circuit board 30B.

The first circuit board 30A and the second circuit board 30B are spaced the predetermined insulation distance D apart. That is, the first IC chip 11 and the second IC chip 21 are also spaced the predetermined insulation distance D. Furthermore, the first IC chip 11 and the second IC chip 21 are arranged in corresponding positions on the circuit boards when viewed in a lamination direction, i.e., in a plan view Accordingly, the first IC chip 11 and the second IC chip 21 may wirelessly transfer data and power to each other in an insulated state as described above.

According to the present invention, since a circuit board may be separated and laminated using two IC chips, a circuit may be designed more freely than the prior art, thus providing an advantage in terms of securing a space. Furthermore, when the first circuit board 30A and the second circuit board 30B are designed as a laminate type, the first circuit board 30A and the second circuit board 30B maintain the same insulation distance D overall, and thus the first IC chip 11 and the second IC chip 21 may be located in any positions on the circuit boards provided that they are arranged in identical positions (i.e., corresponding positions) of the circuit boards in a lamination direction (i.e., vertical direction). Therefore, a circuit may be designed more freely.

Furthermore, although separate circuit boards are designed as a laminate type in the above embodiment, the separate circuit boards may be arranged side by side.

Furthermore, although circuit systems have been described, the present invention may be implemented as an IC chip applied in a circuit system. Therefore, an IC chip according to the present invention may be applied instead of an insulating element in any field of circuits in which an insulating element is used.

In another embodiment, the present invention may be implemented as a battery pack.

For example, a battery pack according to an embodiment of the present invention includes a plurality of battery cells and a battery management system for managing charging/discharging of the battery cells. The battery management system includes a circuit element including at least a first IC chip and a second IC chip, a first circuit board of a first voltage region having a predetermined voltage range, and a second circuit board of a second voltage region having a voltage range lower than that of the first voltage region. Here, the first IC chip and the second IC chip are arranged in different boards among the first circuit board and the second circuit board.

Figure 7:
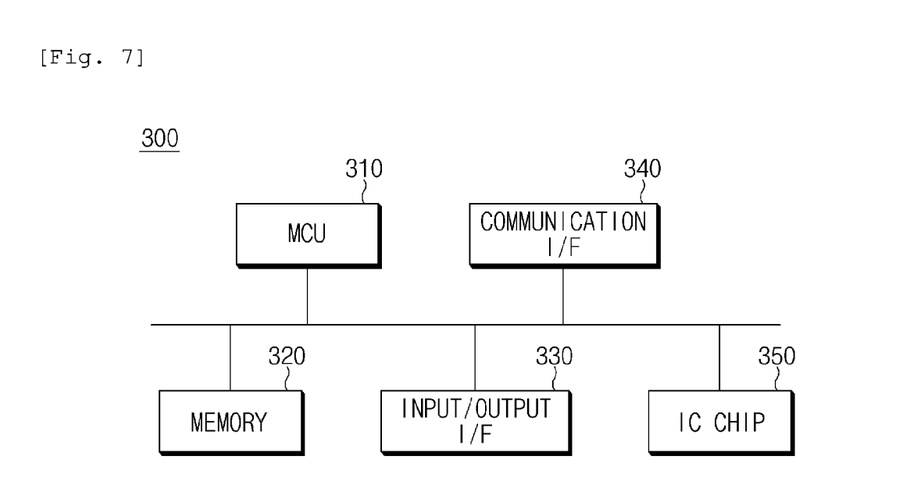
FIG. 7 is a block diagram illustrating a hardware configuration of a battery management system (BMS) according to an embodiment of the present invention.

Furthermore, the BMS of the present invention may be illustrated as hardware as shown in FIG. 7. FIG. 7 is a block diagram illustrating a hardware configuration of a battery management system (BMS) according to an embodiment of the present invention.

As illustrated in FIG. 7, a battery management system 300 includes an MCU 310 for controlling various processes and each element, a memory 320, in which an operating system program and various programs (e.g., a battery charging/discharging control program, a battery abnormality diagnosis program, or the like) are recorded, an input/output interface 330, which provides an input interface and output interface between a battery and/or a switching unit, a communication interface 340 capable of communicating with the outside (e.g., an upper-level controller) via a wired/wireless communication network, and IC chips 350 arranged in different voltage regions and capable of performing inter-chip wireless data communication and power transmission/reception. In other words, at least one circuit unit on a circuit board of the BMS may include the MCU 310, the memory 320, the input/output interface 330, the communication interface 340, and the IC chips 350.

Although the present invention has been described with reference to limited embodiments and drawings, the present invention is not limited thereto, and those skilled in the art could make various modifications within the scope of the technical concept of the present invention and the following claims.

The invention claimed is:

1. A circuit system comprising:
   a first integrated circuit (IC) chip positioned in a first voltage region of the circuit system; and
   a second IC chip positioned in a second voltage region of the circuit system, wherein the first voltage region and the second voltage region are in an insulated state from one another,
   wherein each of the first IC chip and the second IC chip includes a respective data communication unit configured to wirelessly transmit/receive data and a power transmission/reception unit configured to wirelessly transmit/receive power, and
   wherein the first IC chip and the second IC chip are configured to wirelessly transfer data and power to each other in the insulated state between the first voltage region and the second voltage region,
   wherein the first voltage region is a high-voltage region of at least a predetermined voltage, and the second voltage region is a low-voltage region of less than the predetermined voltage.

2. The circuit system of claim 1, wherein the first IC chip and the second IC chip are at least a predetermined insulation distance apart to maintain the insulated state, wherein the predetermined insulation distance is a function of a voltage difference between the high-voltage region and the low-voltage region.

3. The circuit system of claim 2, wherein the first IC chip and the second IC chip are spaced apart by at most the predetermined insulation distance.

4. The circuit system of claim 1, wherein the power transmission/reception unit is configured to wirelessly transmit/receive power using a wireless charging technology.

5. The circuit system of claim 1, wherein the circuit system is included in a battery management system (BMS).

6. The circuit system of claim 1, wherein the first IC chip and second IC chip are positioned on separate circuit boards to maintain the insulated state.

7. The circuit system of claim 1, wherein the first IC chip and the second IC chip are positioned on a common circuit board.

8. A plurality of IC chips arranged in respective voltage regions of a circuit system, wherein the respective voltage regions are in an insulated state from one another, each of the plurality of IC chips comprising:
   a data communication unit configured to wirelessly transmit/receive data between different IC chips while maintaining the insulated state between the respective voltage regions; and
   a power transmission/reception unit capable of wirelessly transmit/receive power between the different IC chips while maintaining the insulated state between the respective voltage regions,
   wherein the different voltage regions comprise a first voltage region which is a high-voltage region of at least a predetermined voltage and a second voltage region which is a low-voltage region of less than the predetermined voltage.

9. The IC chips of claim 8, wherein the power transmission/reception unit is configured to wirelessly transmit/receive power using a wireless charging technology.

10. The plurality of IC chips of claim 8, wherein at least two of the plurality of IC chips are positioned on separate circuit boards to maintain the insulated state.

11. The plurality of IC chips of claim 8, wherein the plurality of IC chips are positioned on a common circuit board at least a predetermined insulation distance apart from one another to maintain the insulated state.

12. The plurality of IC chips of claim 11, wherein each of the plurality of IC chips is spaced a predetermined minimum insulation distance from at least another one of the plurality of IC chips.

13. A battery pack comprising:
   a plurality of battery cells; and
   a battery management system configured to manage charging/discharging of the battery cells,
   wherein the battery management system comprises:
   a first circuit board of a first voltage region having a predetermined voltage range;
   a second circuit board of a second voltage region having a voltage range lower than that of the first voltage region; and
   a circuit element comprising at least the first IC chip arranged on the first circuit board and a second IC chip arranged on the second circuit board, wherein the first IC chip and the second IC chip are configured to wirelessly transfer data and power to each other.

* * * * *